United States Patent [19]
Seki et al.

[11] Patent Number: 5,729,186
[45] Date of Patent: Mar. 17, 1998

[54] RESONATOR LADDER SURFACE ACOUSTIC WAVE FILTER SUPPRESSING SPURIOUS SIGNALS

[75] Inventors: Shun-ichi Seki, Hyogo; Kazuo Eda, Nara; Yutaka Taguchi, Osaka; Keiji Onishi, Osaka; Hiroki Sato, Osaka; Osamu Kawasaki, Kyoto, all of Japan

[73] Assignee: Matsushita Electric Industrial Co., Ltd., Osaka, Japan

[21] Appl. No.: 629,978

[22] Filed: Apr. 9, 1996

[30] Foreign Application Priority Data

| Apr. 12, 1995 | [JP] | Japan | 7-086840 |
| Aug. 21, 1995 | [JP] | Japan | 7-211744 |

[51] Int. Cl.⁶ ................................ H03H 9/64
[52] U.S. Cl. ................ 333/194; 333/195; 310/313 A; 310/313 B
[58] Field of Search ............. 333/193–196; 310/313 R, 313 B, 313 C, 313 D, 313 A

[56] References Cited

U.S. PATENT DOCUMENTS

| 4,635,009 | 1/1987 | Ebata | 333/196 |
| 4,837,476 | 6/1989 | Mochizuki | 333/195 |
| 4,978,879 | 12/1990 | Satoh et al. | 333/194 |
| 5,471,178 | 11/1995 | Hickernell | 333/195 |
| 5,506,552 | 4/1996 | Seki et al. | 333/195 |

FOREIGN PATENT DOCUMENTS

| 0 541 284 | 5/1993 | European Pat. Off. . | |
| 1-19814 | 1/1989 | Japan | 333/195 |
| 2-250412 | 10/1990 | Japan | 333/195 |
| 2-250413 | 10/1990 | Japan | 333/195 |
| 2-250416 | 10/1990 | Japan | 333/195 |
| 6-188673 | 7/1994 | Japan . | |
| 6-291600 | 10/1994 | Japan . | |

OTHER PUBLICATIONS

"The Institute of Electronics and Communication Engineers of Japan", 84/1, vol. J67-C No. 1, pp. 158–165.
"Simple estimation for SSBW excitation strength", by M. Yamaguchi et al., J. Acoust. Soc., Jpn. (E)6, 1(1985), pp. 51–54.

*Primary Examiner*—Robert Pascal
*Assistant Examiner*—Barbara Summons
*Attorney, Agent, or Firm*—Mechant, Gould, Smith, Edell, Welter & Schmidt, P.A.

[57] ABSTRACT

A resonator ladder surface acoustic wave (SAW) filter, which has a wide and flat pass band without spurious signals therein is provided. An input electrode, a serial arm SAW resonator, an output electrode, a parallel arm SAW resonator and a ground electrode are respectively formed on a 41°-rotated Y-cut X-propagation lithium niobate substrate. The serial arm SAW resonator comprises a pair of interdigital transducers (IDTs) to excite SAW, one of which is connected to the input electrode. The output electrode is connected to the other IDT of the serial arm SAW resonator. The parallel arm SAW resonator comprises a pair of IDTs to excite SAW, one of which is connected to the output electrode. And the ground electrode is connected to the other IDT of the parallel arm SAW resonator. The IDTs are metal films of Al or Al-based alloy, and the thickness of the metal films ranges from 2.5% to 7.5% of the electrode cycle of the IDT of the parallel arm SAW resonator.

20 Claims, 16 Drawing Sheets

RESONATOR LADDER SURFACE ACOUSTIC WAVE FILTER SUPPRESSING SPURIOUS SIGNALS

FIELD OF THE INVENTION

This invention relates to an surface acoustic wave (SAW) filter that can excite a surface acoustic wave on a substrate of a piezoelectric material and selectively extract a desired frequency band. This invention especially relates to a resonator surface acoustic wave (SAW) filter which is suitable for a high-frequency filter of a portable communication apparatus.

BACKGROUND OF THE INVENTION

Surface acoustic wave (SAW) filters are often used as high-frequency filters for portable communication apparatuses. Among such SAW filters, resonator ladder SAW filters have been useful since they have certain advantages, including lower insertion loss and a superior 50Ω matching characteristic.

A conventional resonator ladder SAW filter is explained below. The principle of such a resonator ladder SAW filter is the same as the conventional ceramic ladder filter, except that the resonator is replaced by a SAW resonator. In this case, the resonant frequency of a SAW resonator connected in series to the input-output terminals (hereinafter, serial arm SAW resonator) and the anti-resonant frequency of another SAW resonator connected in parallel to the input-output terminals (hereinafter, parallel arm SAW resonator) are almost matched to each other. As a result, a filter characteristic can be obtained, namely, the vicinity of this frequency becomes the pass band while the frequency higher than the anti-resonant frequency of the serial arm SAW resonator and the frequency lower than the resonant frequency of the parallel arm SAW resonator are rejection bands.

The width of the pass band in a resonator ladder SAW filter is related to the electromechanical coupling coefficient of a piezoelectric substrate. Namely, when the electromechanical coupling coefficient is larger, the difference between the resonant frequency and the anti-resonant frequency of the SAW resonator becomes larger, and the pass band becomes wider. A 36°-rotated Y-cut X-propagation lithium tantalate substrate has a comparatively large electromechanical coupling coefficient (about 5%). This substrate meets the standards of 800 MHz band portable communication apparatuses adopted by NTT in Japan, AMPS in the North America, and GSM in Europe, whose pass band width ratios (pass band/center frequency) are about 3%. Therefore, such a substrate generally can be used to obtain a good filter characteristic.

Recently, filters having an extremely wide pass band have been required so that a plurality of standards can be used with a single portable communication apparatus. An NTT analog standard and an NTT digital standard can be taken as an example. In order to utilize them together, a receiving filter which has a pass band including NTT digital standard (810 MHz to 830 MHz) and NTT analog standard (860 MHz to 885 MHz) is necessary. In this case, the pass band width ratio is about 9%. The conventional 36°-rotated Y-cut X-propagation lithium tantalate substrate cannot correspond to such a band. FIG. 17 shows an example of the frequency characteristics of a receiving filter for the NTT analog standard, which is formed on the conventional 36°-rotated Y-cut X-propagation lithium tantalate substrate.

64°-rotated Y-cut X-propagation lithium niobate substrate and 41°-rotated Y-cut X-propagation lithium niobate substrate are known as piezoelectric substrates that have electromechanical coupling coefficients larger than that of the 36°-rotated Y-cut X-propagation lithium tantalate substrate. The electromechanical coupling coefficient of the piezoelectric substrate of the former substrate is about 11%, and that of the latter substrate is about 17%. At present, only the 41°-rotated Y-cut X-propagation lithium niobate substrate may provide the ratio pass band width of 9%.

However, an article collection by the Institute of Electronics and Communication Engineers of Japan (84/1, Vol. J67-C No. 1, p 158–165) teaches the following problem. A pseudo surface acoustic wave (hereinafter a leaky SAW) as the main wave is propagated on to the 41°-rotated Y-cut X-propagation lithium niobate substrate, while coupling with a bulk wave due to the excitation of the interdigital transducer (IDT) and radiating the energy into the substrate. A surface skimming bulk wave (SSBW) which is radiated almost in parallel to the substrate surface also is propagated. In addition, a strong piezoelectric characteristic also complicates these SAW excitation characteristics. The metal surface on the 41°-rotated Y-cut X-propagation lithium niobate substrate is electrically short-circuited. The velocity of the SAW propagation on the metal surface is about 4790 m/s (SSBW), and about 4370 m/s (leaky SAW). Accordingly, in the case of a conventional SAW resonator which has IDT and a resonator using this substrate, the resonant characteristics of the leaky SAW and of the SSBW have different frequencies (cf. FIG. 15). If a resonator ladder SAW filter is composed of this SAW resonator, spurious signals corresponding to the anti-resonant point on the leaky SAW in the serial arm SAW resonator are at the center of the filter's pass band, and thus ripples appear in the pass band. As a result, the pass band becomes narrow. As mentioned in Published Unexamined (Kokai) Japanese Patent Application No. Hei 6-291600, the SAW resonator can be constructed with only IDT, without providing reflectors on the both sides of the IDTs along the SAW's propagation direction. Then, the propagation of the leaky SAW is controlled as shown in FIG. 16, and spurious signals can be avoided.

Surface acoustic wave resonators using 41°-rotated Y-cut X-propagation lithium niobate substrate have already been proposed. However, there has not been an example in which a resonator ladder SAW filter is formed on the 41°-rotated Y-cut X-propagation lithium niobate substrate. When such a 41°-rotated Y-cut X-propagation lithium niobate substrate is used, the reflecting coefficient of the SAW at the electrode finger ends of the IDT is larger. Thus, lots of fine spurious signals appear in the resonant characteristic due to the internal reflection of the SAW in the IDT.

SUMMARY OF THE INVENTION

This invention aims to provide a resonator ladder surface acoustic wave (SAW) filter having a wide and flat pass band without spurious signals therein, and having a good frequency characteristic.

In order to achieve such purposes, a first resonator ladder SAW filter of this invention comprises at least one serial arm SAW resonator and at least one parallel arm SAW resonator on a 41°-rotated Y-cut X-propagation lithium niobate substrate. Both arm SAW resonators comprise interdigital transducers (IDTs) to excite SAW. The IDT is made of a metal film of Al or Al-based alloy. The thickness of the metal film ranges from 2.5% to 7.5% of the electrode cycle of the IDT of the parallel arm SAW resonator, so that the spurious signals practically do not cause problems, and a good frequency characteristic is obtained.

According to the first embodiment, it is preferable that the thickness of the metal film ranges from 4% to 7% of the electrode cycle of the IDT of the parallel arm SAW resonator, so that the spurious signals can be controlled completely, and a better frequency characteristic is obtained.

A second resonator ladder SAW filter of this invention comprises at least one serial arm SAW resonator and at least one parallel arm SAW resonator on a 41°-rotated Y-cut X-propagation lithium niobate substrate. Both arm SAW resonators comprise interdigital transducers (IDTs) to excite SAW. The IDT is made of a metal film of any electrode material except for Al. When the density of Al is $\rho_{Al}$ and the density of the electrode material is $\rho_{Me}$, the thickness of the metal film ranges from $2.5 \cdot \rho_{Al}/\rho_{Me}\%$ to $7.5 \cdot \rho_{Al}/\rho_{Me}\%$ of the electrode cycle of the IDT of the parallel arm SAW resonator, so that the spurious signals practically do not cause problems, and a good frequency characteristic is obtained.

According to the second embodiment, it is preferable that the thickness of the metal film ranges from $4 \cdot \rho_{Al}/\rho_{Me}\%$ to $7 \cdot \rho_{Al}/\rho_{Me}\%$ of the electrode cycle of the IDT of the parallel arm SAW resonator, so that the spurious signals can be controlled completely, and a better frequency characteristic is obtained.

It is preferable that reflectors are provided on both sides of the IDT of the parallel arm SAW resonator along the SAW propagation direction. According to this embodiment, the difference between the resonant frequency and anti-resonant frequency becomes larger and the pass band becomes wider. As a result, a good frequency characteristic is obtained. Here, d is the center distance between the closest electrode fingers of the reflector and of the IDT of the parallel SAW resonator, n is zero or an integer larger than zero, α is one or a real number smaller than one, and L is the electrode cycle of the IDT of the parallel SAW resonator. According to this preferable example, α ranges from 0.8 to 1.0 where d=(α+n)·L/2. In this case, the difference between the resonant frequency and the anti-resonant frequency becomes larger and the pass band becomes wider. As a result, a good frequency characteristic is obtained.

It is preferable that reflectors are further provided on both sides of the IDT of the serial arm SAW resonator along the SAW propagation direction. According to this embodiment, the difference between the resonant frequency and anti-resonant frequency becomes larger and the pass band becomes wider. As a result, a good frequency characteristic is obtained. Here, Pr is the center distance between the adjacent electrode fingers in a reflector of the serial arm SAW resonator, p is a real number, and Pi is the center distance between the adjacent electrode fingers in the IDT of the serial arm SAW resonator. According to a preferable example in which p ranges from 0.96 to 1.96 when Pr=p·Pi, the difference between the resonant frequency and the anti-resonant frequency becomes larger and the pass band becomes wider. As a result, a good frequency characteristic is obtained.

It is preferable in this embodiment that the number of pairs (N) of the opposing electrode fingers in the IDT is at least 50. According to this embodiment, the SAW is not leaked in the SAW propagating direction of the IDT. As a result, the loss can be controlled without a reflector.

It is preferable that W is at least 8 when W is a value standardized by eliminating the aperture (WD) of the opposing electrode fingers in the IDT with the electrode cycle L of the IDT (W=WD/L). According to this embodiment, a spurious signal does not appear in the pass band, and the inside of the pass band is flat. As a result, a good frequency characteristic can be obtained.

It is preferable that η ranges from 0.2 to 0.5 when Lm is the width of the electrode finger of the IDT, Lg is the gap width of the electrode fingers, and η=Lm/(Lm+Lg). According to this embodiment, the ripples in the pass band become smaller, and the pass band becomes wider. As a result, a good frequency characteristic can be obtained.

It is preferable that the opposing electrode fingers in at least one IDT of a resonator selected from the group consisting of the serial arm SAW resonator and the parallel arm SAW resonator have varying apertures. According to this embodiment, the internal reflecting efficiency in the IDT is improved, while the loss and the ripples of the resonator ladder SAW filter are controlled. As a result, a better frequency characteristic can be obtained.

In this invention, both the leaky SAW (a kind of bulk wave) and the SSBW (surface skimming bulk wave) are called surface acoustic waves.

DETAILED DESCRIPTION OF THIS INVENTION

The First Embodiment

Figure 1A:
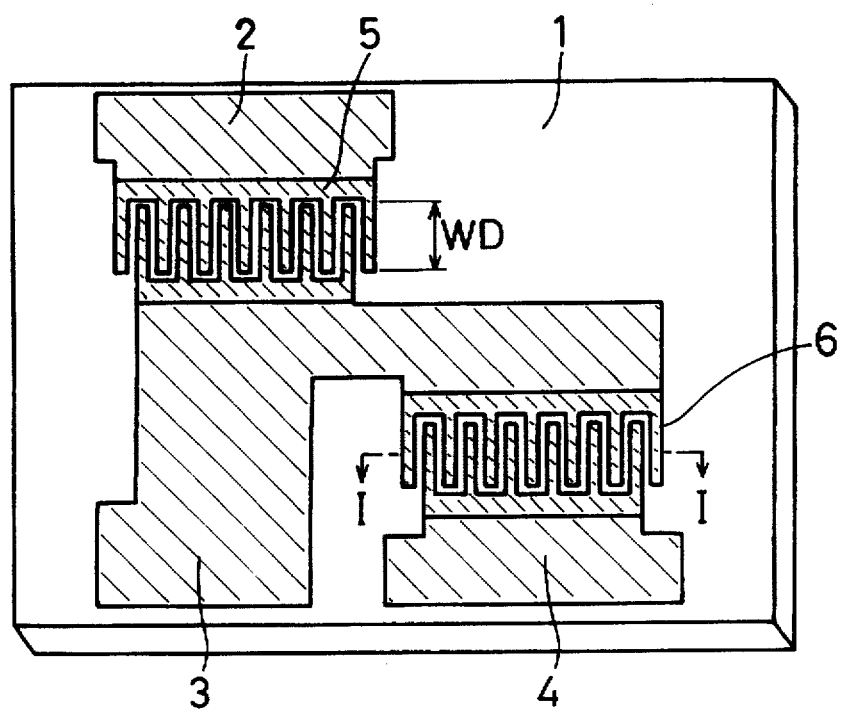
FIG. 1(a) is a schematic view showing the surface of the substrate of a resonator ladder SAW filter of the first embodiment of this invention.
Figure 1B:
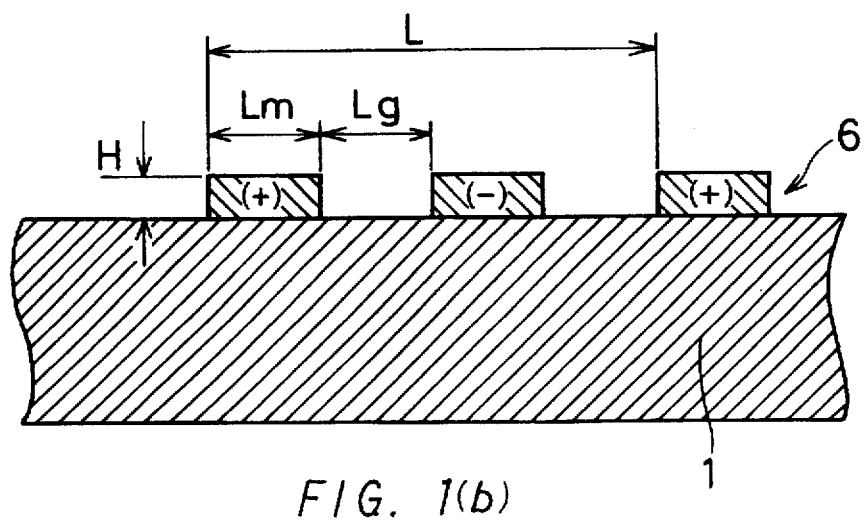
FIG. 1(b) is a cross-sectional view along line I—I of FIG. 1(a).

FIG. 1(a) is a schematic view showing the surface of the substrate of a resonator ladder SAW filter of the first embodiment of this invention, and FIG. 1(b) is a portion of the cross-sectional view along line I—I of FIG. 1(a).

As shown in FIG. 1(a) and FIG. 1(b), an input electrode 2, a serial arm SAW resonator 5, an output electrode 3, a parallel arm SAW resonator 6 and a ground electrode 4 are formed on a 41°-rotated Y-cut X-propagation lithium niobate substrate 1, so that a resonator ladder SAW filter is formed. The serial arm elastic wave resonator 5 comprises a pair of interdigital transducers (IDTs) to excite a surface acoustic wave, and one of the IDTs is connected to the input electrode 2. The output electrode 3 is connected to the other IDT of the resonator 5. The parallel arm SAW resonator 6 comprises a pair of IDTs to excite SAW. One of the IDTs is connected to the output electrode 3, and the ground electrode 4 is connected to the other IDT of the parallel resonator 6. Reflectors are not provided on either side of the IDTs of the resonators 5 and 6 along the direction of the SAW propagation. The electrode film thickness H (the metal film thickness of IDT) in FIG. 1(b) is an important variable to determine the characteristics of the resonator. A resonator should have a good frequency characteristic without spurious signals. Therefore, an examination was carried out to find which value is the best for the electrode film thickness H.

Figure 2:
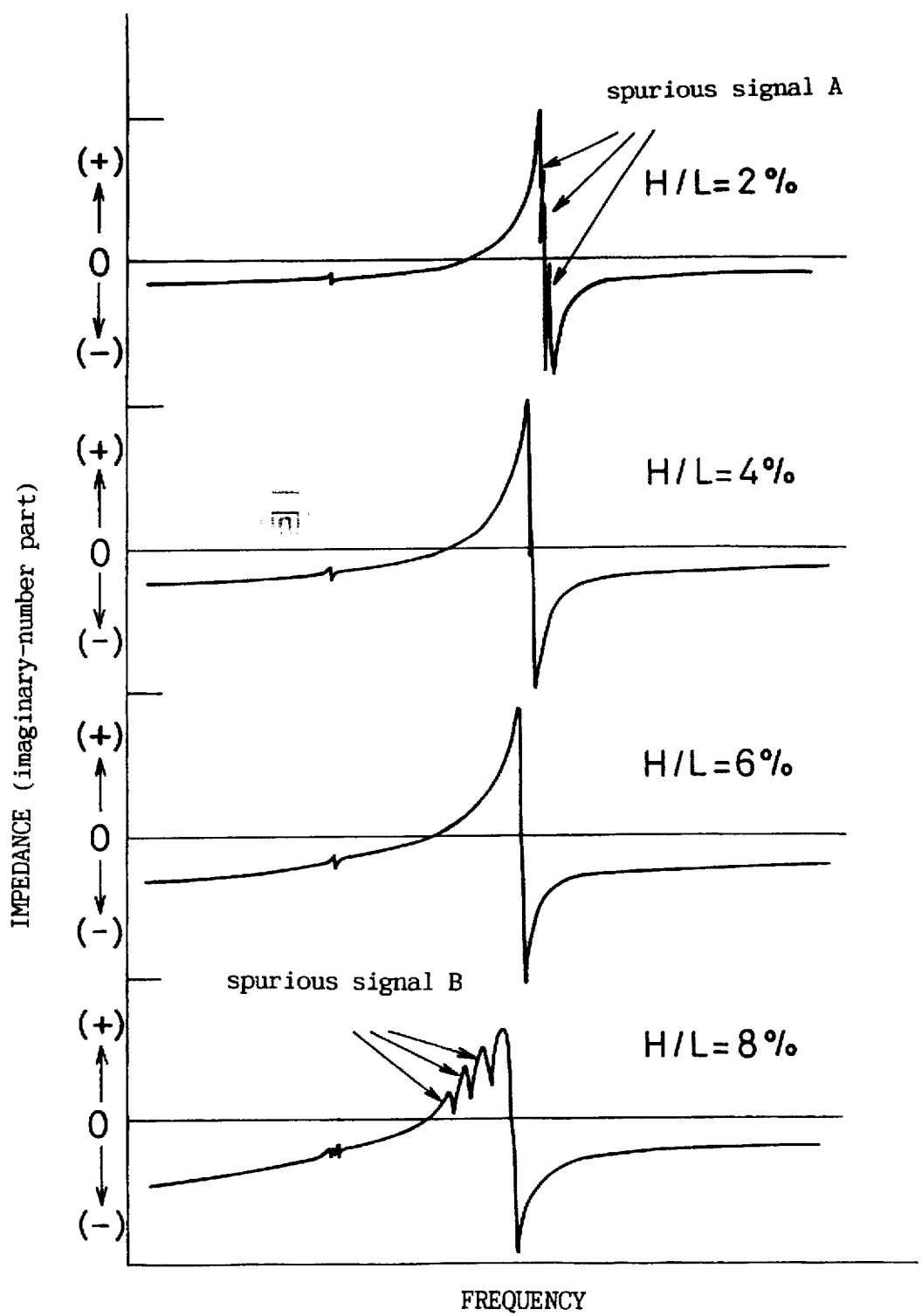
FIG. 2 is a graph showing the experimental result of the frequency characteristic of the imaginary-number part of the impedance, where the thickness of the electrode film is a variable in the SAW resonator of the first embodiment.

FIG. 2 is a graph showing the experimental result of the frequency characteristic of the imaginary-number part of the impedance, where the thickness of the electrode film is a variable in the SAW resonator. The structure of the SAW resonator is explained below. The electrode material is Al, the number of pairs of the IDT's electrode fingers is 100, and the aperture WD of the opposing electrode fingers in the IDT (cf. FIG. 1(a)) is 15 times the electrode cycle L (cf. FIG. 1(b)—the electrode cycle is equal to the wavelength of the SAW which is substantially excited) of the IDT. The electrode film thickness is standardized by dividing the actual electrode film thickness H by the IDT's electrode cycle L. As shown in FIG. 2, the resonator does not sufficiently resonate when the relative electrode film thickness (H/L) is as thin as about 2%, and spurious signal A appears. However, as the electrode film is thicker, the spurious signal A becomes smaller and vanishes. When the relative electrode film thickness (H/L) is up to about 8%, another spurious signal B appears because of other waves like a bulk wave other than SSBW. The resonance characteristics of the SAW resonator were further examined when the relative electrode film thickness (H/L) ranges from 2% to 8%. When the thickness (H/L) ranges from 2.5% to 7.5%, the spurious signals do not cause problems for practical use. When the relative thickness (H/L) ranges from 4% to 7%, the spurious signals were completely controlled and the best frequency characteristic was obtained.

In this embodiment, Al is used for the electrode material. A metal film of Al alloy, or a laminated layer of plural Al or Al alloy metal films were also used for several purposes like improvement of the electric power resistance characteristic. The Al alloy was prepared by mixing several weight % of different metals like Cu, Ti, Si and Sc. The range of the preferable thickness was almost the same as this embodiment. It is preferable in this embodiment that the quantity of Al contained in the Al alloy is at least 70%.

The dependence of the frequency characteristic on the relative electrode film thickness of the SAW resonator depends on the weight of the metal film. In other words, when the electrode material is not Al, the best relative electrode thickness can be obtained by multiplying the above-mentioned relative electrode thickness by the ratio between the density of Al and the density of the other electrode material. Therefore, when the Al density is $\rho_{Al}$ and the density of the optional electrode material is $\rho_{Me}$, the relative electrode film thickness should be from $2.5 \cdot \rho_{Al}/\rho_{Me}\%$ to $7.5 \cdot \rho_{Al}/\rho_{Me}\%$ so that the spurious signals do not cause problems for a practical use. If the electric material is Au, $\rho_{Au}$ is 18.9 and $\rho_{Al}$ is 2.7. Thus the relative electrode film thickness should be from 0.36% to 1.07% to control the spurious signals and to avoid practical problems. The spurious signals are completely controlled and the best frequency characteristic can be obtained when the relative thickness ranges from 0.57% to 1.0%.

Figure 3:
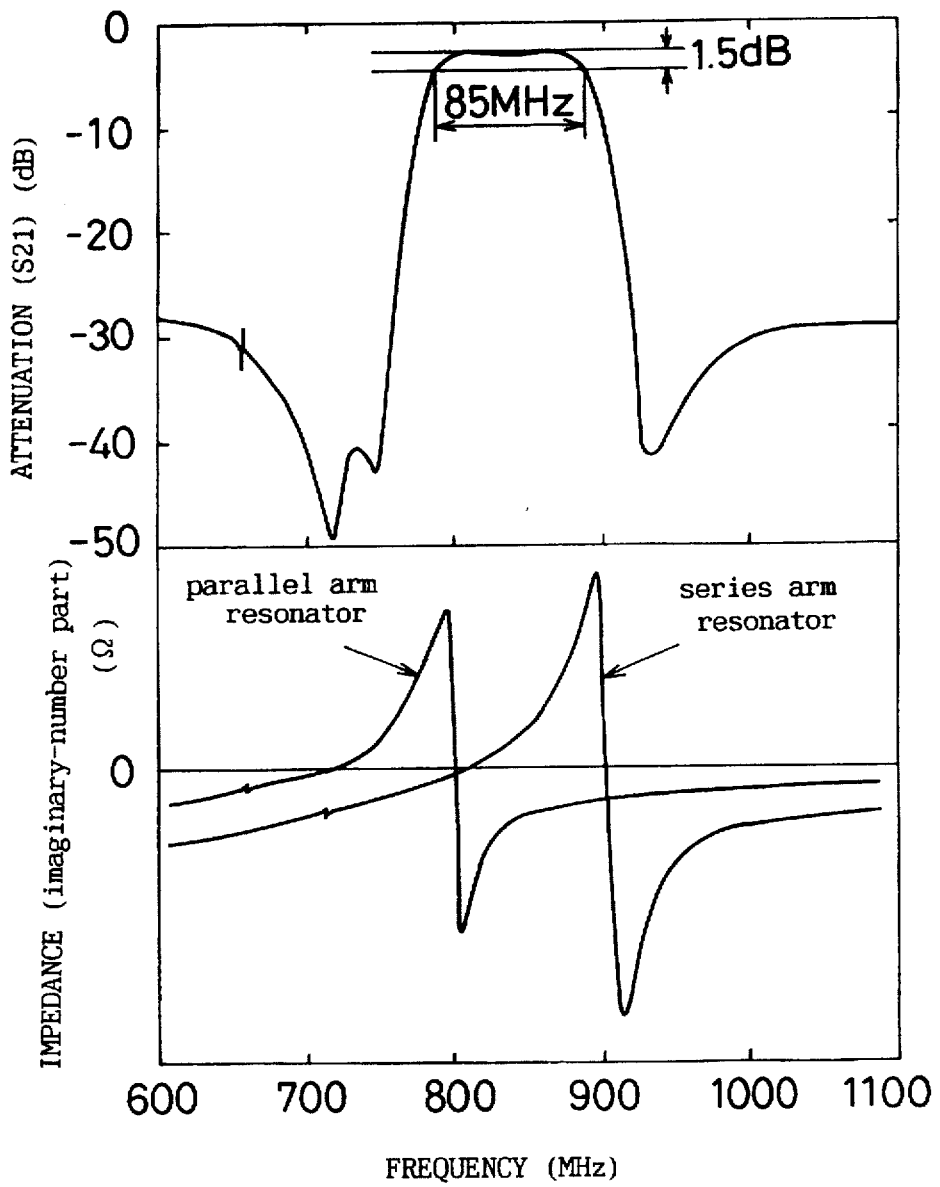
FIG. 3 is a graph showing the experimental result of the frequency characteristic of the Al-containing resonator ladder SAW filter of the first embodiment.
Figure 4:
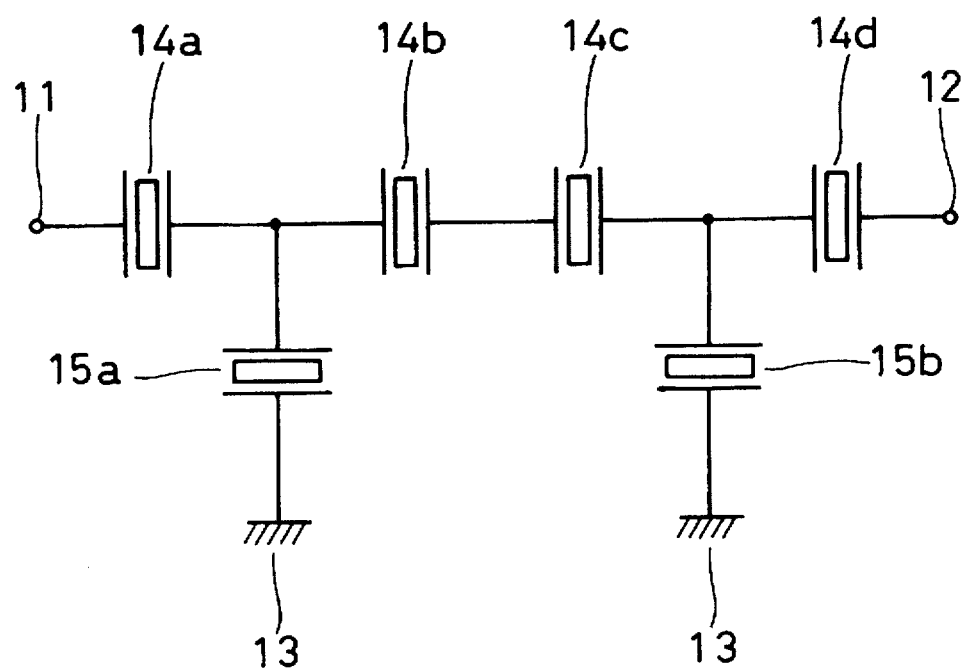
FIG. 4 is a circuit diagram of the resonator ladder SAW filter which has the T-type two-step structure of the first embodiment.

FIG. 3 is a graph showing the experimental result of the frequency characteristic of the Al-containing resonator ladder SAW filter. The electrode film thickness of the filter is 6% of the IDT's electrode cycle of the parallel arm SAW resonator. As shown in FIG. 4, the resonator ladder SAW filter has a T-type two-step structure. In other words, this filter has four serial arm SAW resonators (14a, 14b, 14c, 14d) and two parallel arm SAW resonators (15a, 15b). The serial arm SAW resonators are disposed in series between an input electrode terminal 11 and an output electrode terminal 12. The parallel arm SAW resonator 15a is disposed between a ground electrode terminal 13 and a connecting wire, which connects to the resonator 14a connected to the input electrode terminal 11 and the adjacent resonator 14b. The parallel arm SAW resonator 15b is disposed between a ground electrode terminal 13 and a connecting wire, which connects to the resonator 14d connected to the output electrode terminal 12 and the adjacent resonator 14c. Regarding the serial arm SAW resonators, the width of the IDT's electrode fingers is 1.190 μm, the IDT's electrode cycle is 4.760 μm, the number of pairs of the opposing electrode fingers in the IDT is 120.5 pairs and the aperture of the electrode fingers opposed in the IDT is 40 μm. As for the parallel arm SAW resonators (15a, 15b), the electrode fingers of the IDT are 1.340 μm wide, the IDT's electrode cycle is 5.360 μm, the number of pairs of the opposing electrode fingers in the IDT is 150.5 pairs, and the aperture of the electrode fingers opposed in the IDT is 70 μm. As shown in FIG. 3, this resonator ladder SAW filter comprises serial and parallel SAW resonators, and has a good frequency characteristic without spurious signals. As a result, a superior frequency characteristic can be obtained over a wide band (the pass band 1.5 dB below from the lowest insertion loss is 85 MHz) which has no spurious signals and a small ripple of 1.5 dB.

The frequency characteristic of a resonator ladder SAW filter is influenced by the number of pairs of the IDT's electrode fingers, the aperture of the opposing electrode fingers in the IDT, and the IDT metallization ratio. These factors were examined by manufacturing a resonator ladder SAW filter of the T-type two-step structure as shown in FIG. 4. SAW resonators are used for serial and parallel arms, so that an equation N·W=150 holds true, where N is the number of pairs of the IDT's electrode fingers, and W is the value which is standardized by dividing the aperture (WD) of the opposing electrode fingers in the IDT by the electrode cycle L. Thus, W=WD/L. The electrode cycles of the serial and parallel SAW resonators (14a–14d, 15a, and 15b) are the same as that of the resonator ladder SAW filter shown in FIG. 3. It means that the electrode cycle of the IDT of the serial arm SAW resonators is 4.760 μm and the electrode cycle of the IDT of the parallel arm SAW resonators is 5.360 μm. And the electrode thickness (Al) is 6% of the IDT's electrode cycle of the parallel SAW resonators (15a, 15b).

Figure 5:
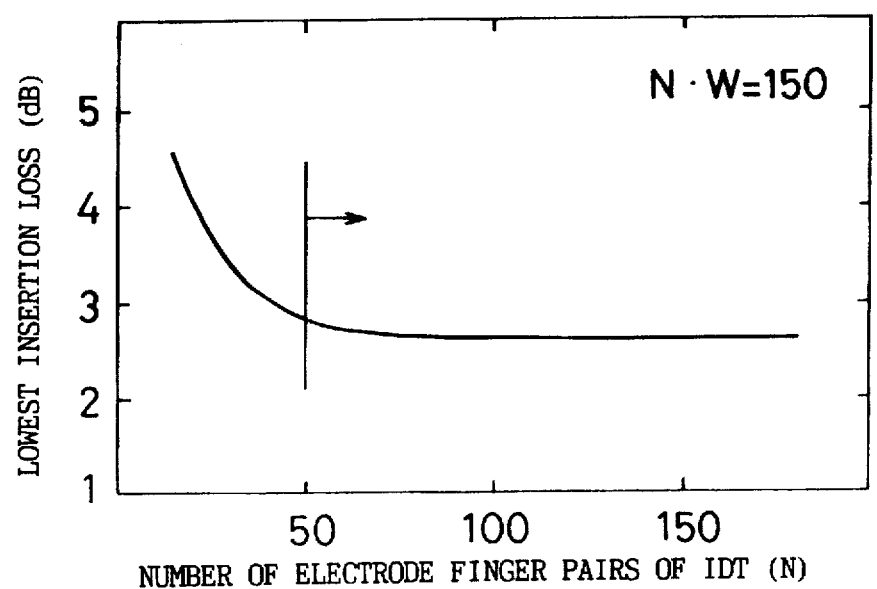
FIG. 5 is a graph showing the experimental result of the relation between the lowest insertion loss and the number of pairs of the electrode fingers of the IDT in the resonator ladder SAW filter of the first embodiment.

The frequency characteristic of the resonator ladder SAW filter is influenced by the number of pairs of the IDT's electrode fingers. Since this SAW resonator does not have reflectors, the surface acoustic wave is somewhat leaked in the direction of the IDT's SAW propagation. Thus the loss is greater compared to a resonator having reflectors. This problem, however, may be solved if the number of pairs of the IDT's electrode fingers is increased. FIG. 5 shows the experimental result of the relation between the lowest insertion loss and the number of pairs N of the IDT's electrode fingers when N·W=150. It is clear from the graph that the lowest insertion loss of the resonator ladder SAW filter rapidly increases when the number of pairs N of the IDT's electrode fingers is smaller than 50 pairs. Therefore, the SAW leakeage does not cause a problem if the number of pairs N is at least 50 pairs.

Figure 6:
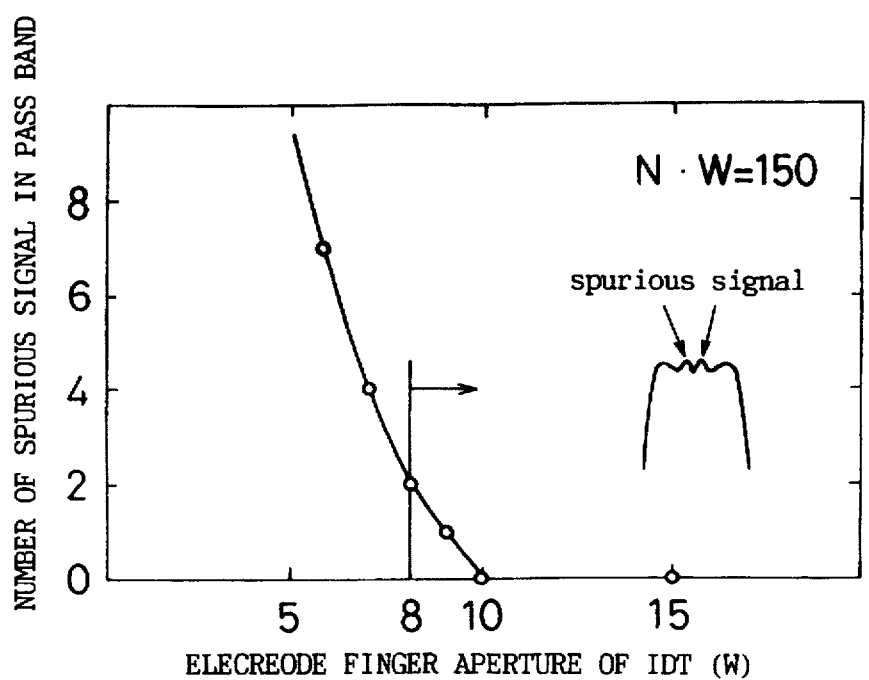
FIG. 6 is a graph showing the experimental result of the relation between the number of spurious signals in the pass band and the aperture of the opposing electrode fingers in the IDT in the resonator ladder SAW filter of the first embodiment.

The frequency characteristics of the resonator ladder SAW filter are influenced by the aperture of the opposing electrode fingers in the IDT. FIG. 6 shows the experimental result of the relation between the standardized electrode finger's aperture W and the number of the spurious signals in the pass band. As shown in this graph, spurious signals do not exist in the pass band when the aperture is at least ten. However, spurious signals appear when the aperture is smaller than ten, since diffraction of SAW at the tip of the IDT increases and the resonant frequency deviates when the aperture of the opposing electrode fingers becomes narrow. When the spurious signals number in the pass band is limited to two, the aperture W may be at least eight.

Figure 7:
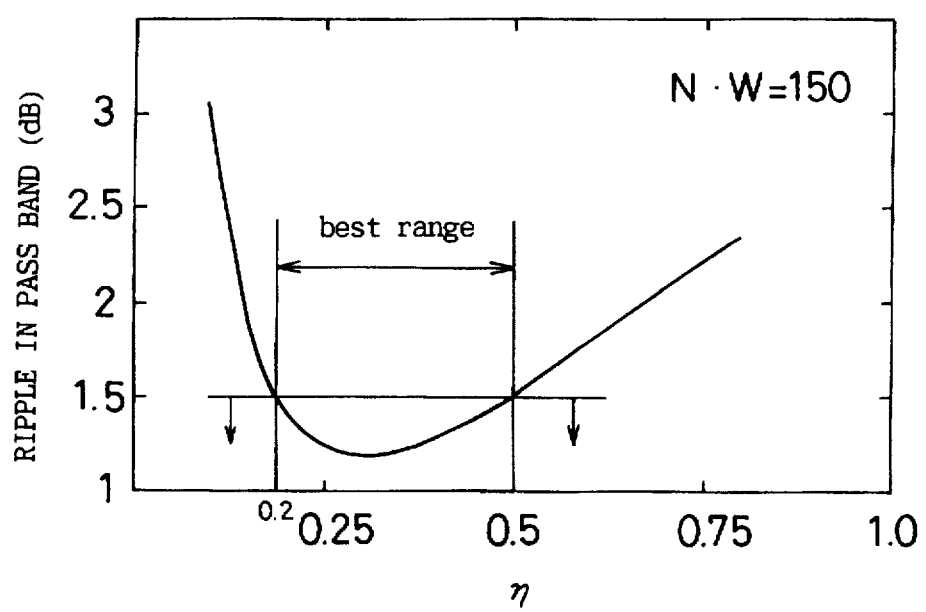
FIG. 7 is a graph showing the experimental result of the relation between the IDT metallization ratio and the ripple in the pass band of the IDT in the resonator ladder SAW filter of the first embodiment.

The frequency characteristic of a resonator ladder SAW filter is influenced by the IDT metallization ratio. Here, Lm is the width of the IDT's electrode fingers, Lg is the gap width of the electrode fingers(cf. FIG. 1(b)), and η=Lm/(Lm+Lg). FIG. 7 shows the experimental result of the relation between η and the ripple in the pass band. Here, a ripple is the difference between the lowest insertion loss and an insertion loss which can keep a pass band of 85 MHz (cf. FIG. 3). As shown in FIG. 7, when η is more than 0.5, the ripple in the pass band becomes bigger and when η is less than 0.5, the ripple in the pass band becomes smaller. However, if η is about 0.3 or smaller than 0.3, the electric resistance of the IDT increases. As a result, the insertion loss rapidly increases. In addition, the ripple in the pass band rapidly grows since the frequency characteristic of the filter becomes inactive. Therefore, η should be from 0.2 to 0.5 so that the ripple in the pass band is kept smaller than the value of ripple where η=0.5. When η ranges from 0.2 to 0.5, the ripple in the pass band becomes smaller and the pass band becomes wider. As a result, a good frequency characteristic can be obtained.

Figure 8:
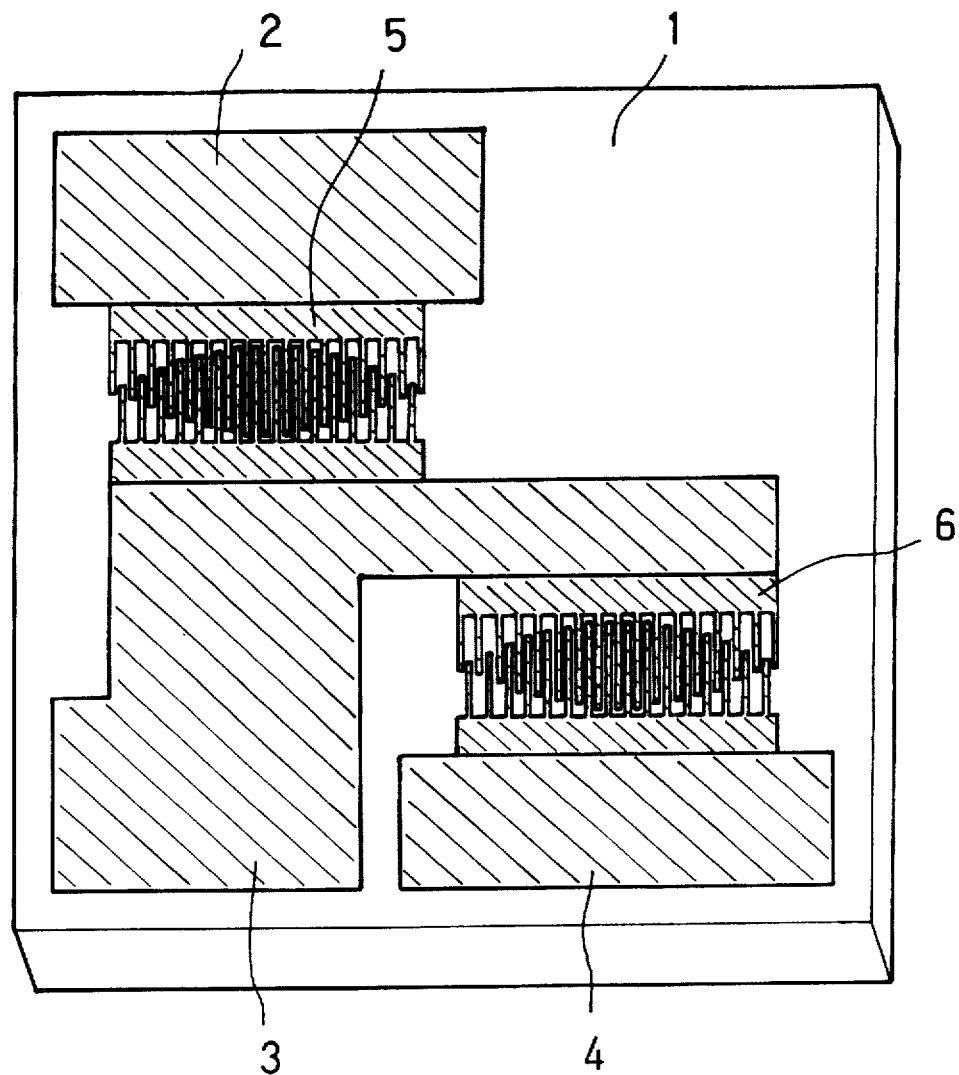
FIG. 8 is a schematic view showing another example of the resonator ladder SAW filter of the first embodiment.

It is also possible to change at least one aperture of the opposing electrode fingers in the IDTs of the resonator 5 or 6 as shown in FIG. 8, so that the internal reflecting efficiency of the SAW in the IDT is improved, and the loss and ripple of the resonator ladder SAW filter can be lowered. As a result, a better frequency characteristic will be obtained.

Accordingly, the resonator ladder SAW filter of this invention realizes a better resonant frequency characteristic compared to conventional resonator ladder SAW filters, namely a frequency characteristic having a wide pass band without spurious signals and with a small ripple therein.

The Second Embodiment

Figure 9:
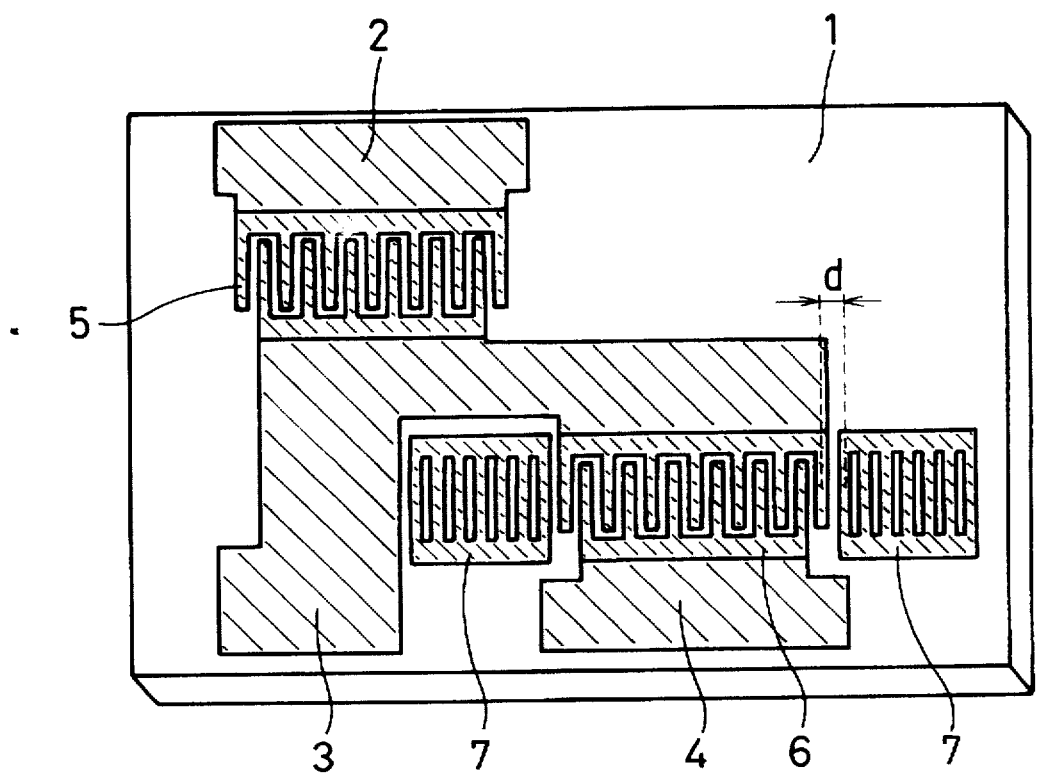
FIG. 9 is a schematic view showing the resonator ladder SAW filter of the second embodiment of this invention.
Figure 15:
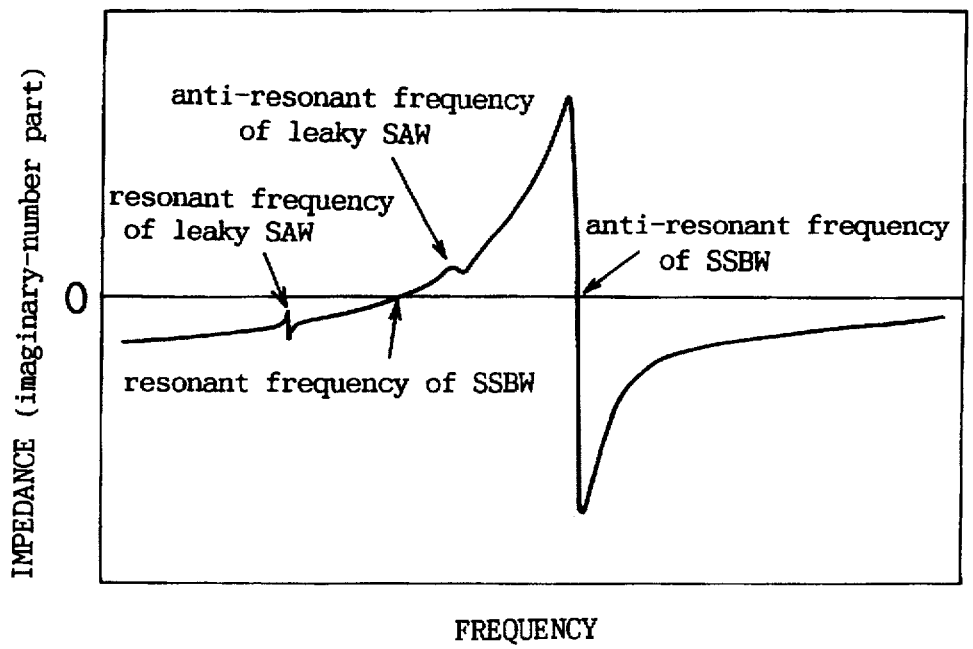
FIG. 15 is a graph showing the frequency characteristic of a conventional SAW resonator having a reflector.
Figure 16:
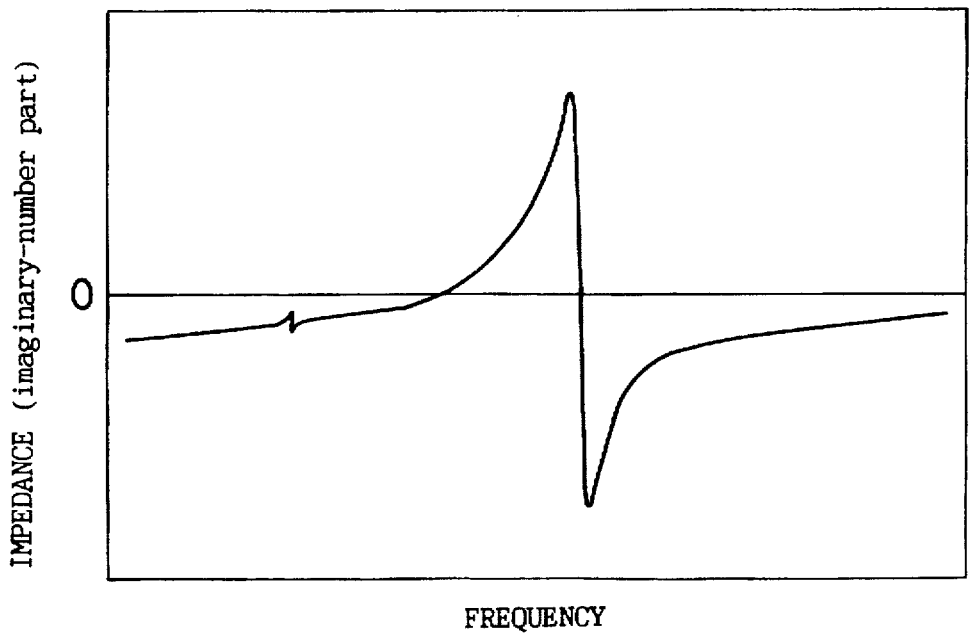
FIG. 16 is a graph showing the frequency characteristic of a conventional SAW resonator without a reflector.
Figure 17:
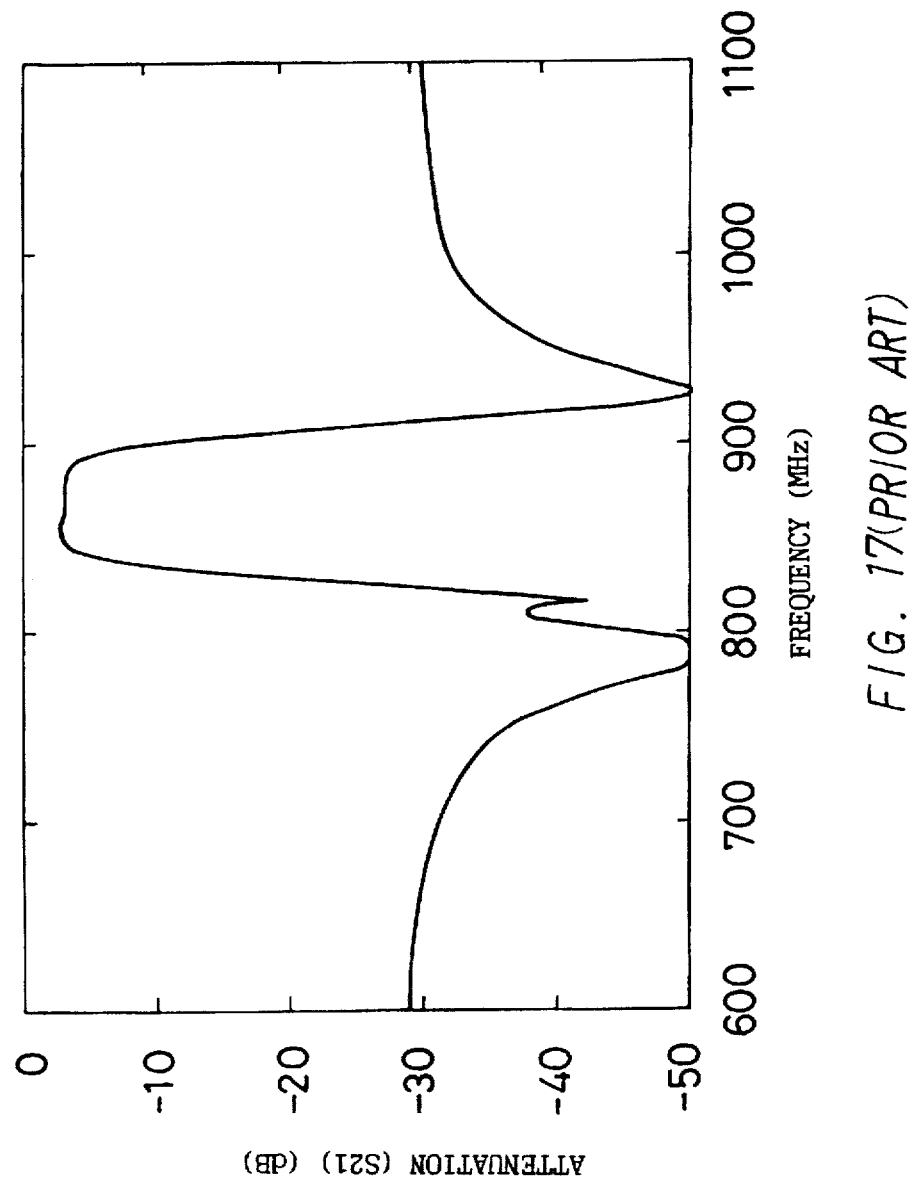
FIG. 17 is a graph showing the frequency characteristic of a conventional resonator ladder SAW filter.

FIG. 9 is a schematic view showing the resonator ladder SAW filter of the second embodiment of this invention. As shown in FIG. 9, an input electrode 2, a serial arm SAW resonator 5, an output electrode 3, a parallel SAW resonator 6, and a ground electrode 4 are provided on a 41°-rotated Y-cut X-propagation lithium niobate substrate 1. The serial arm SAW resonator 5 comprises a pair of IDTs to excite SAW, and one of the IDTs is connected to the input electrode 2. The output electrode 3 is connected to the other IDT of the serial arm SAW resonator 5. The parallel arm SAW resonator 6 comprises a pair of IDTs to excite SAW. One of the IDTs is connected to the output electrode 3 and the ground electrode 4 is connected to the other IDT of the resonator 6. Reflectors 7 are formed on both sides of the IDTs of the resonator 6 along the propagation direction of the surface acoustic wave. When the reflectors are provided for the resonator 6, spurious signals due to the leaky SAW appear in the frequency characteristic (cf. FIG. 15). However, the pass band becomes wider for the filter since the difference between the resonant frequency and the anti-resonant frequency become larger. As a result, a good frequency characteristic can be obtained.

Figure 10:
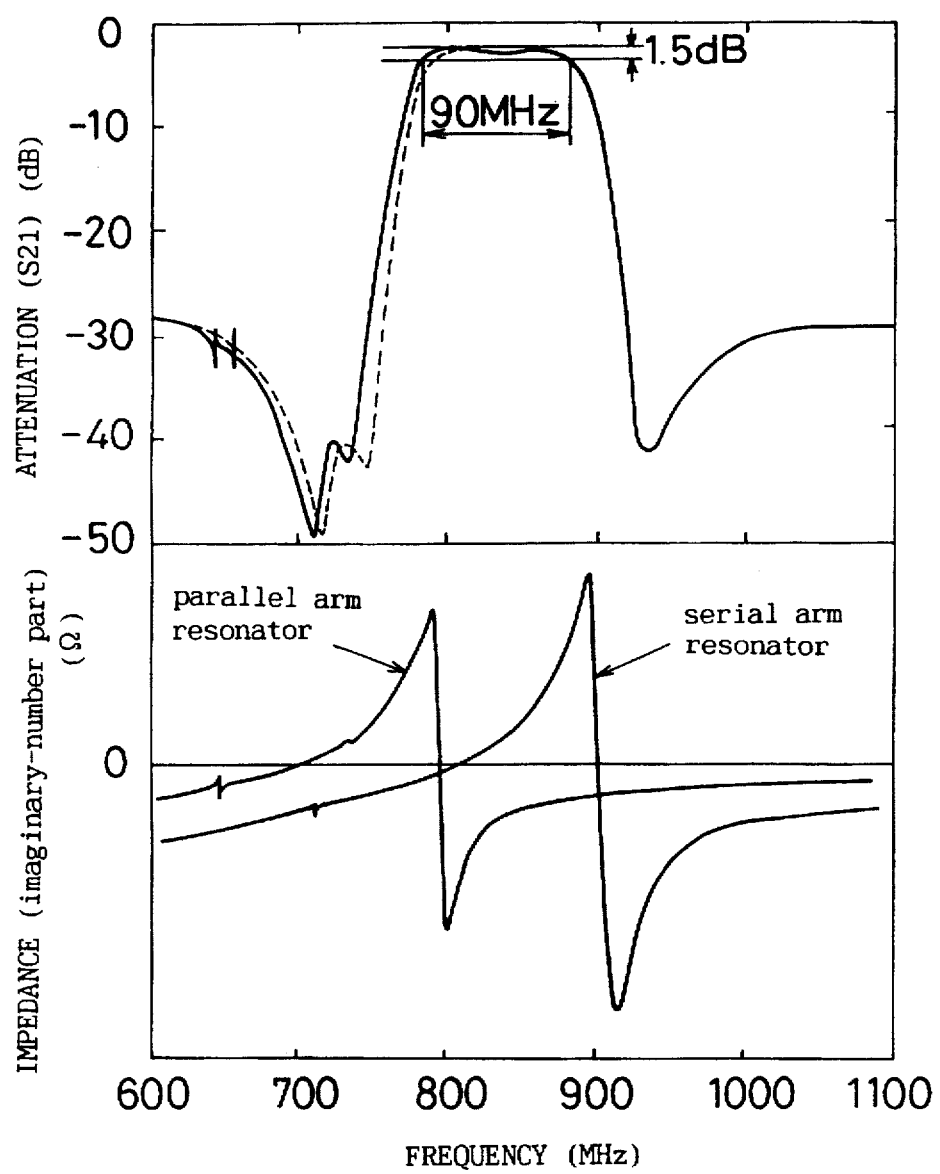
FIG. 10 is a graph showing the experimental result of the frequency characteristic of the resonator ladder SAW filter of the second embodiment.

FIG. 10 shows the experimental result of the frequency characteristic of the resonator ladder SAW filter shown in FIG. 9. Both parallel arm SAW resonators (15a, 15b) have reflectors that are provided on both sides of the IDT of the parallel arm SAW resonator along the SAW propagating direction. This filter has a T-type two-step structure as shown in FIG. 4. In FIG. 10, the broken line shows the frequency characteristic of the resonator SAW filter shown in FIG. 3. According to the serial arm SAW resonators in FIG. 4 (14a, 14b, 14c, and 14d), the width of the electrode fingers of the IDT is 1.190 μm, the electrode cycle of the IDT is 4.760 μm, the number of pairs of the opposing electrode fingers in the IDT is 120.5 pairs, the aperture of the opposing electrode fingers in the IDT is 40 μm. As for the parallel arm SAW resonators 15a and 15b (cf. FIG. 4), the width of the electrode fingers of the IDT is 1.340 μm, the electrode cycle of the IDT is 5.360 μm, the number of pairs of the opposing electrode fingers in the IDT is 120.5 pairs, and the aperture of the opposing electrode fingers in the IDT is 70 μm. The width of the reflector's electrode fingers is 1.340 μm, the electrode cycle of the reflector is 4.760 μm, the numbers of the electrode fingers aligned in the reflector is 50, and the aperture of the adjacent electrode fingers in the reflector is 45 μm. Here, d is the center distance between the closest electrode fingers of the reflectors and of the IDTs of the parallel arm SAW resonators (15a, 15b) which are opposing each other. When d=(α+n)·L/2, α=0.9 and n=0. As shown in FIG. 10, the resonator ladder SAW filter of this invention has a wide pass band, though the rising edge into the pass band is less steep than the resonator ladder SAW filter shown in FIG. 3. In other words, 90 MHz is kept as a pass band at the point lower by 1.5 dB from the lowest insertion loss.

Figure 11:
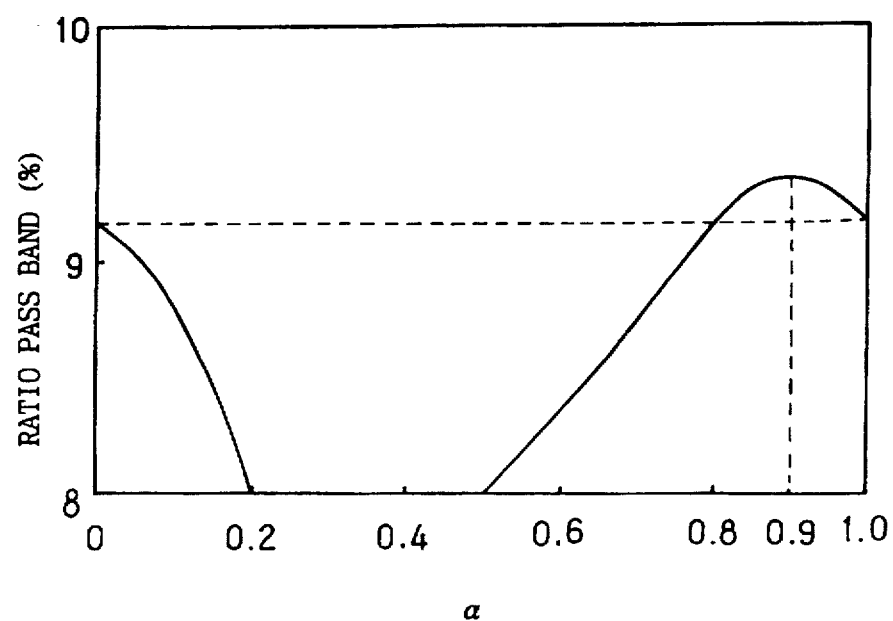
FIG. 11 is a graph showing the experimental result of the relation between the center distance of the electrode fingers of the IDT and the resonator, and the pass band width according to the resonator ladder SAW filter of the second embodiment.

Regarding the resonator ladder SAW filter of this embodiment, d is the center distance of the closest electrode finger of a reflector and that of the IDT of the parallel arm SAW resonator, which are opposing each other. When $d=(\alpha+n)\cdot L/2$, $\alpha=0.9$ and $n=0$ where $\alpha$ is one or a real number smaller than one. The reason is as follows. Spurious signals by the leaky SAW shown in FIG. 15 occur since reflectors are provided on both sides of the IDT of the parallel arm SAW resonator along the propagating direction of the surface acoustic wave. When the center distance d is equal to the center distance of the opposing electrode fingers in the IDT, these spurious signals exist in the pass band of the resonator ladder SAW filter, and cause ripples. When the distance d is wider, the spurious signals move to the low-frequency side, and are extracted to the outside of the pass band when $\alpha$ is about 0.5. When $\alpha=1$, the value is as the same as when $\alpha=0$. In other words, these spurious signals move according to the cycle of L/2. FIG. 11 shows the experimental result of the relation between $\alpha$ and the pass band. The pass band is determined 1.5 dB lower from lowest insertion loss. As shown in FIG. 11, the pass band is the widest when $\alpha=0.9$. The pass band is wider when. a ranges from 0.8 to 1.0, compared to the case where $\alpha=0$. When $\alpha$ is about 0.2 to 0.5 in however, the ripples in the pass band are 1.5 dB or more because of the spurious signals in the pass band. As a result, determination of the pass band is impossible.

As mentioned in the first embodiment, the frequency characteristic of the resonator ladder SAW filter is influenced by the number of pairs of the IDT's electrode fingers, the aperture of the opposing electrode finger in the IDT, and the IDT metallization ratio.

The frequency characteristic of the resonator ladder SAW filter is influenced by the changed aperture of the IDT, as mentioned in the first embodiment.

In this embodiment, it is possible to change at least one part of the aperture of the electrode fingers in the IDT of the serial arm SAW resonator 5 or of the parallel arm SAW resonator 6 (cf. FIG. 8), so that the internal reflecting efficiency of the SAW in the IDT is improved while the loss and ripples of the resonator ladder SAW filter can be controlled. As a result, a better frequency characteristic is obtained.

As mentioned above, the resonator ladder SAW filter of this embodiment provides a better frequency characteristic with a wide pass band, compared to that of the conventional resonator ladder SAW filter.

The Third Embodiment

Figure 12:
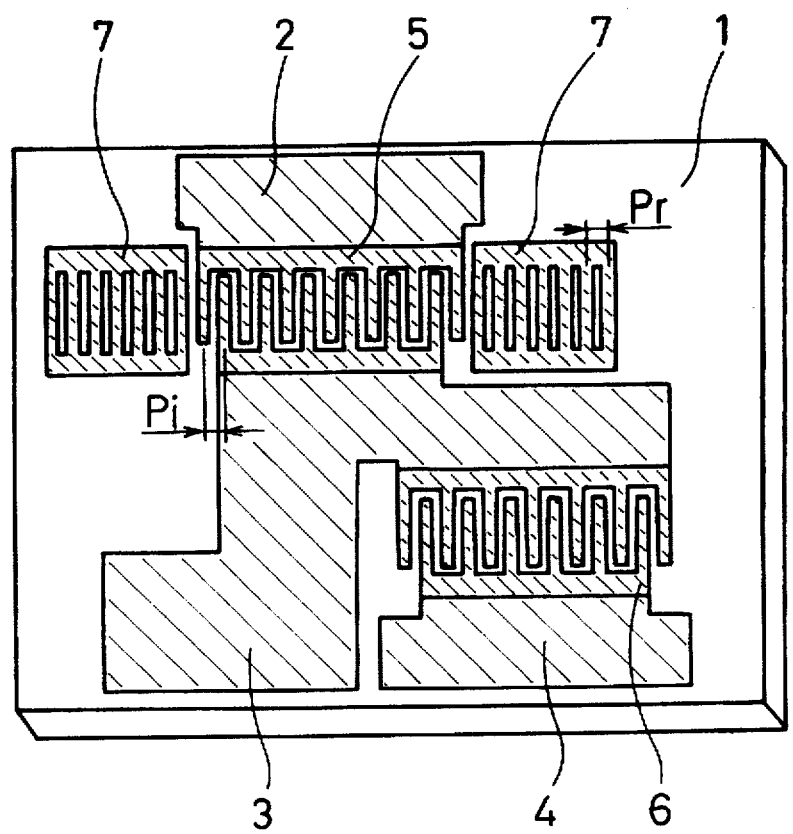
FIG. 12 is a schematic view showing the resonator ladder SAW filter of the third embodiment of this invention.

FIG. 12 is a schematic view showing the resonator ladder SAW filter of the third embodiment of this invention. As shown in FIG. 12, an input electrode 2, a serial arm SAW resonator 5, an output electrode 3, a parallel arm SAW resonator 6, and a ground electrode 4 are respectively formed on a 41°-rotated Y-cut X-propagation lithium niobate substrate 1. The serial arm SAW resonator 5 comprises a pair of IDTs to excite SAW, and one of the IDTs is connected to the input electrode 2. The output electrode 3 is connected to the other IDT of the resonator 5. The parallel arm SAW resonator 6 comprises a pair of IDT to excite SAW, and one of the IDTs is connected to the output electrode 4. And the ground electrode 4 is connected to the other IDT of the resonator 6. In addition, reflectors 7 are formed on the 41°-rotated Y-cut X-propagation lithium niobate substrate 1 along the propagating direction of the surface acoustic wave of the IDT of the serial arm SAW resonator 5. When reflectors 7 are provided for the resonator 5, spurious signals caused by the leaky SAW appear in the frequency characteristic as in the case of the second embodiment (cf. FIG. 15). However, the difference between the resonance frequency and the anti-resonance frequency becomes larger, and the pass band becomes wider for the filter. Thus, the frequency characteristic is improved. However, the spurious signals by the leaky SAW of the resonator 5 are shown around the middle of the filter's pass band. Therefore, the spurious signals by the leaky SAW in the pass band become ripples if there are too many electrode fingers in the reflectors 7. To solve this problem, the number of the electrode fingers of the reflectors should be controlled to permit ripples. The range depends on the requirements of the filter, and generally, should be 50 at most.

Figure 13:
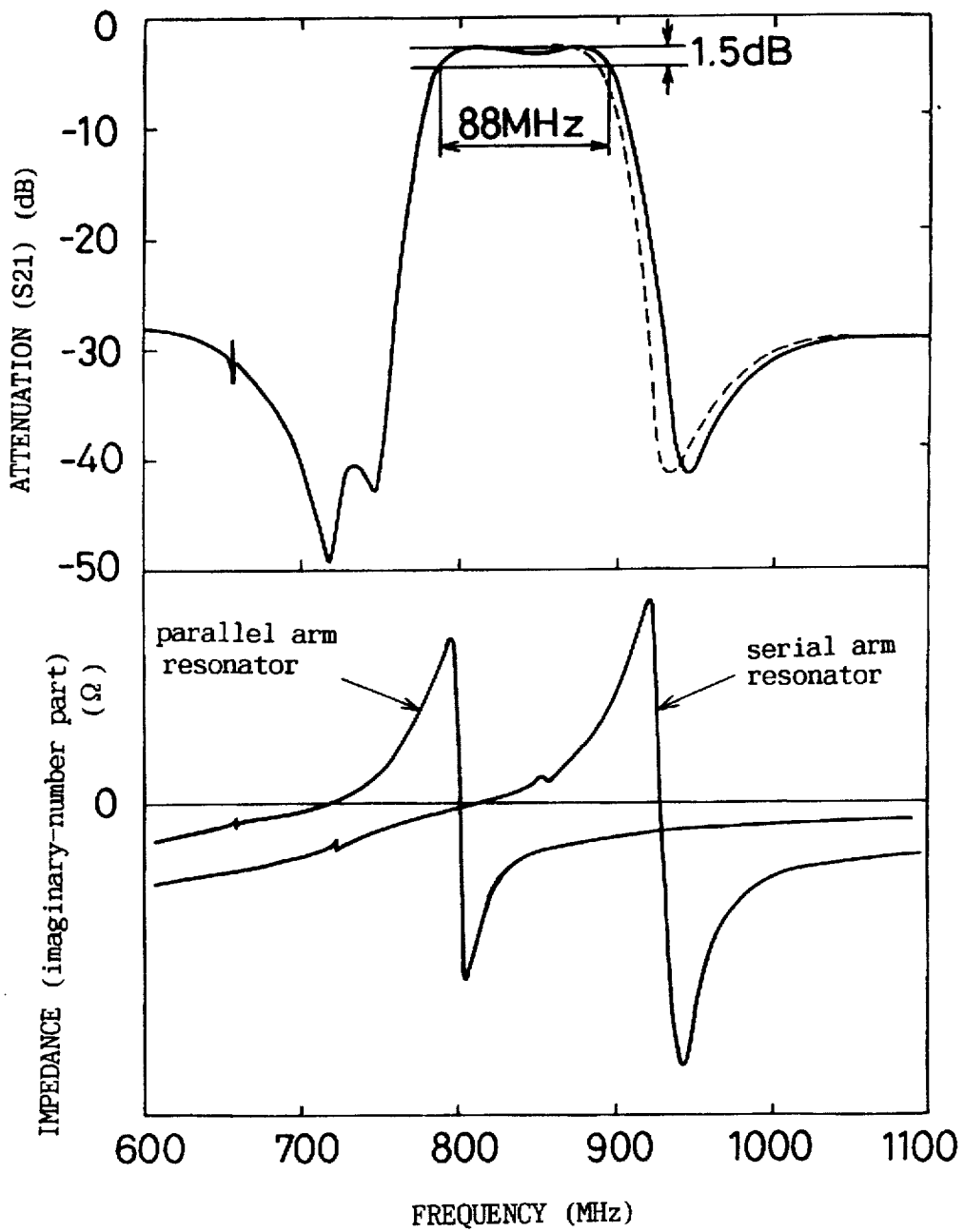
FIG. 13 is a graph showing the experimental result of the frequency characteristic of the resonator ladder SAW filter of the third embodiment.

FIG. 13 is a graph showing the experimental result of the frequency characteristic of the T-type two-step resonator ladder SAW filter made of Al. The electrode film thickness of the filter is 6% of the IDT's electrode cycle of the parallel arm SAW resonator, The percentage is the same as the case of the resonator ladder SAW filter shown in FIG. 3. As for the serial arm SAW resonator 5, the width of the IDT's electrode fingers is 1.185 µm, the IDT's electrode cycle is 4.740 µm, the number of pairs of the opposing electrode fingers in the IDT is 120.5 pairs, and the aperture of the opposing electrode fingers in the IDT is 40 µm. With respect to the resonators 7, the number of the electrode fingers is 50, and the aperture of the adjacent electrode fingers is 45 µm. When Pr is the center distance between the adjacent electrode fingers in the reflector 7 of the serial arm SAW resonator 5 (cf. FIG. 12) and $Pr=p\cdot Pi$, $p=0.98$. In this equation, p is a real number, and Pi is the center distance between the adjacent electrode fingers in the IDT of the serial arm SAW filter 5 shown in FIG. 12. As for the parallel arm SAW resonator 6, the width of the IDT's electrode finger is 1.340 µm, the IDT's electrode cycle is 5.360 µm, the number of pairs of the opposing electrode fingers in the IDT is 150.5 pairs, and the aperture of the opposing electrode fingers in the IDT is 70 µm.

Figure 14:
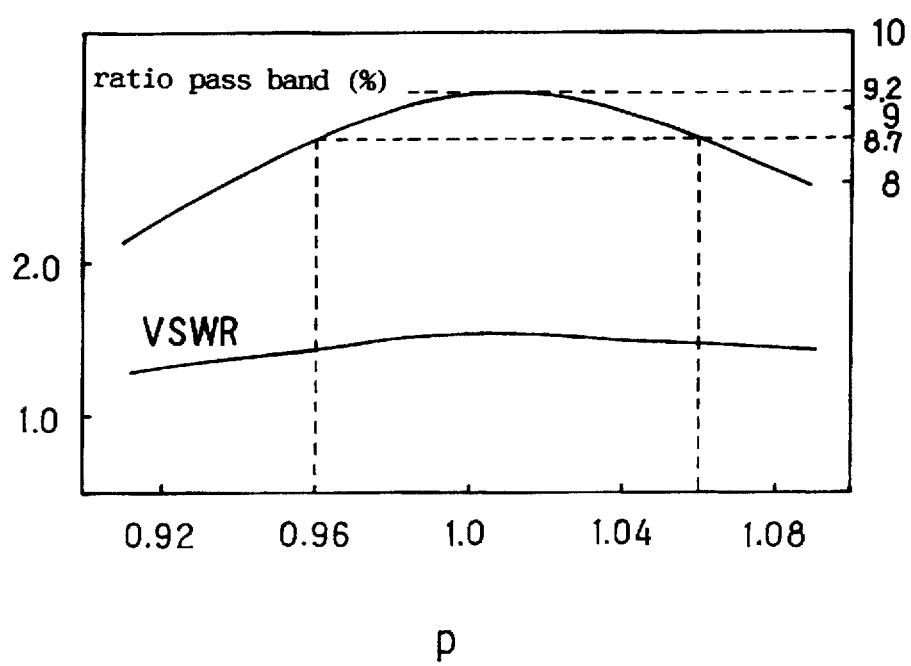
FIG. 14 is a graph showing the experimental result of the relation between p (of the resonator) and VSNR, and between p and pass band width according to the resonator ladder SAW filter of the third embodiment.

In this embodiment, the value of p of the reflector of the serial arm SAW resonator is predetermined to be 0.98. The reason is explained below. FIG. 14 is a graph showing the experimental result of the relation between p and voltage standing wave ratio (VSWR) and also between p and pass band. The pass band is determined at the point 1.5 dB lower than the lowest insertion loss. VSWR is the ratio relating to the incident wave and the reflected wave of the SAW filter, and the value is at least one. As VSWR is closer to one, the reflected wave is smaller and matching with the external circuit is improved. As shown in FIG. 14, VSWR is maximum when p of the reflector 7 is one, and becomes smaller as p is far from one. On the other hand, the pass band is widest when p is one, and becomes narrow when p of the reflectors 7 is far from one. Accordingly, p of the reflectors 7 should be from 0.96 to 1.06, where the permissible decrease of the pass band is 0.5%.

If reflectors 7 are provided for the serial arm SAW resonator 5 as mentioned in this embodiment, the resonant frequency moves to the lower frequency side. In order to obtain the VSWR in the band like the resonator ladder SAW filter of FIG. 3, the electrode cycle of the IDT of the resonator 5 is decreased to move the resonant frequency and the anti-resonant frequency to the high frequency side. Then, the difference between the resonant frequency of the serial arm SAW resonator 5 and the anti-resonant frequency of the parallel arm SAW resonator 6 is similar to that of the resonator ladder SAW filter of FIG. 3. In this way, the pass band becomes wider compared to the resonator ladder SAW filter of FIG. 3, and 88 MHz is kept as the pass band at the point lower than 1.5 dB from the lowest insertion loss (cf. FIG. 13).

As mentioned in the first embodiment, the frequency characteristic of the resonator ladder SAW filter is influenced by the number of pairs of the IDT's electrode fingers, the aperture of the opposing electrode finger in the IDT, and the IDT metallization ratio.

The frequency characteristic of the resonator ladder SAW filter is influenced by the changed aperture of the IDT, as mentioned in the first embodiment.

In this embodiment, it is possible to change at least one part of the aperture of the electrode fingers in the IDT of the serial arm SAW resonator 5 or of the parallel arm SAW resonator 6 (cf. FIG. 8), so that the internal reflecting efficiency of the SAW in the IDT is improved while the loss and ripples of the resonator ladder SAW filter can be controlled. As a result, a better frequency characteristic is obtained.

As mentioned above, the resonator ladder SAW filter of this embodiment provides a better frequency characteristic with a wide pass band, compared to that of the conventional resonator ladder SAW filter.

As mentioned in the three embodiments, this invention provides a resonator ladder surface acoustic wave (SAW) filter which has wide and flat pass band without spurious signals, and a good frequency characteristic.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A resonator ladder surface acoustic wave filter, comprising:
   a 41°-rotated Y-cut X-propagation lithium niobate substrate;
   a serial arm surface acoustic wave resonator on the substrate, having interdigital transducers for exciting a surface acoustic wave;
   a parallel arm surface acoustic wave resonator on the substrate, having interdigital transducers for exciting a surface acoustic wave, the interdigital transducers having an electrode cycle;
   the interdigital transducers of both the serial arm surface acoustic wave resonator and the parallel arm surface acoustic wave resonator being formed from films of a metal selected from the group consisting of aluminum and aluminum alloy, the films having a thickness ranging from 2.5% to 7.5% of the electrode cycle of the interdigital transducers of the parallel arm surface acoustic wave resonator.

2. The resonator ladder surface acoustic wave filter according to claim 1, wherein the thickness of the metal films ranges from 4% to 7% of the electrode cycle.

3. The resonator ladder surface acoustic wave filter according to claim 1, wherein reflectors are provided on both sides of the interdigital transducers of the parallel arm surface acoustic wave resonator along a direction of the surface acoustic wave propagation.

4. The resonator ladder surface acoustic wave filter according to claim 3, wherein $\alpha$ ranges from 0.8 to 1.0 if an equation of $d=(\alpha+n) \cdot L/2$ holds true where d is a center distance between the closest electrode fingers of the reflector and of the interdigital transducers of the parallel arm surface acoustic wave resonator, n is zero or an integer bigger than zero, $\alpha$ is one or a real number smaller than one, and L, is the electrode cycle.

5. The resonator ladder surface acoustic wave filter according to claim 1, wherein reflectors are provided on both sides of the interdigital transducers of the serial arm surface acoustic wave resonator along the direction of a surface acoustic wave propagation.

6. The resonator ladder surface acoustic wave filter according to claim 5, wherein p ranges from 0.96 to 1.06 if an equation of Pr=p·Pi holds true when Pr is a center distance between adjacent electrode fingers in the reflector of the serial arm surface acoustic wave resonator, p is a real number and Pi is the center distance between adjacent electrode fingers in the interdigital transducers of said serial arm surface acoustic wave resonator.

7. The resonator ladder surface acoustic wave filter according to claim 1, wherein the number of pairs (N) of the opposing electrode fingers in the interdigital transducers is at least 50.

8. The resonator ladder surface acoustic wave filter according to claim 1, wherein W is at least 8 when W is a standardized value obtained by dividing an aperture of opposing electrode fingers in the interdigital transducers with the electrode cycle of the interdigital transducers.

9. The resonator ladder surface acoustic wave filter according to claim 1, wherein $\eta$ ranges from 0.2 to 0.5 when Lm is a width of electrode fingers of the interdigital transducers, Lg is a gap width of the electrode fingers, and an equation of $\eta=Lm/(Lm+Lg)$ holds true.

10. The resonator ladder surface acoustic wave filter according to claim 1, wherein opposing electrode fingers in at least one interdigital transducer of the resonator selected from the group consisting of a serial arm surface acoustic wave resonator and a parallel arm surface acoustic wave resonator have varying apertures.

11. A resonator ladder surface acoustic wave filter, comprising:
   a 41°-rotated Y-cut X-propagation lithium niobate substrate;
   a serial arm surface acoustic wave resonator on the substrate, having interdigital transducers for exciting a surface acoustic wave;
   a parallel arm surface acoustic wave resonator on the substrate, having interdigital transducers for exciting a surface acoustic wave, the interdigital transducers having an electrode cycle;
   the interdigital transducers of both the serial arm surface acoustic wave resonator and the parallel arm surface acoustic wave resonator being formed from films of a metal other than aluminum, the films having a thickness ranging from $2.5 \cdot \rho_{Al}/\rho_{Me}\%$ to $7.5 \cdot \rho_{Al}/\rho_{Me}\%$ of the electrode cycle of the interdigital transducers of the parallel arm surface acoustic wave resonator, where $\rho_{Al}$ is the density of Al and $\rho_{Me}$ is the density of the metal other than aluminum of an electrode film material.

12. The resonator ladder surface acoustic wave filter according to claim 11, wherein the thickness of the metal films ranges from $4 \cdot \rho_{Al}/\rho_{Me}\%$ to $7 \cdot \rho_{Al}/\rho_{Me}\%$ of the electrode cycle of the interdigital transducers of the parallel arm surface acoustic wave resonator.

13. The resonator ladder surface acoustic wave filter according to claim 11, wherein reflectors are provided on both sides of the interdigital transducers of the parallel arm surface acoustic wave resonator along the direction of the surface acoustic wave propagation.

14. The resonator ladder surface acoustic wave filter according to claim 13, wherein a ranges from 0.8 to 1.0 if an equation of $d=(\alpha+n)\cdot L/2$ holds true when d is a center distance between closest electrode fingers of the reflector and of the opposing interdigital transducers of the parallel arm surface acoustic wave resonator, n is zero or an integer bigger than zero, $\alpha$ is one or a real number smaller than one, and L is the electrode cycle of the interdigital transducers of said parallel arm surface acoustic wave resonator.

15. The resonator ladder surface acoustic wave filter according to claim 11, wherein reflectors are provided on both sides of the interdigital transducers of the serial arm surface acoustic wave resonator along a direction of a surface acoustic wave propagation.

16. The resonator ladder surface acoustic wave filter according to claim 15, wherein p ranges from 0.96 to 1.06 if an equation of $Pr=p\cdot Pi$ holds true when Pr is a center distance between adjacent electrode fingers in the reflector of the serial arm surface acoustic wave resonator, p is a real number and Pi is a center distance between adjacent electrode fingers in the interdigital transducers of said serial arm surface acoustic wave resonator.

17. The resonator ladder surface acoustic wave filter according to claim 11, wherein the number of pairs (N) of the opposing electrode fingers in the interdigital transducers is at least 50.

18. The resonator ladder surface acoustic wave filter according to claim 11, wherein W is at least 8 when W is a standardized value obtained by dividing an aperture of opposing electrode fingers in the interdigital transducers with the electrode cycle of the interdigital transducers.

19. The resonator ladder surface acoustic wave filter according to claim 11, wherein $\eta$ ranges from 0.2 to 0.5 when Lm is a width of electrode fingers of the interdigital transducers, Lg is a gap width of the electrode fingers, and an equation of $\eta=Lm/(Lm+Lg)$ holds true.

20. The resonator ladder surface acoustic wave filter according to claim 11, wherein opposing electrode fingers in at least one interdigital transducer of the resonator selected from the group consisting of a serial arm surface acoustic wave resonator and a parallel arm surface acoustic wave resonator have varying apertures.

* * * * *